(12) United States Patent
Miller et al.

(10) Patent No.: US 6,953,702 B2
(45) Date of Patent: Oct. 11, 2005

(54) FIXED WAVELENGTH VERTICAL CAVITY OPTICAL DEVICES AND METHOD OF MANUFACTURE THEREFOR

(75) Inventors: Jeffrey N. Miller, Los Altos Hills, CA (US); Virginia M. Robbins, Los Gatos, CA (US); Steven D. Lester, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/151,631

(22) Filed: May 16, 2002

(65) Prior Publication Data

US 2003/0215969 A1 Nov. 20, 2003

(51) Int. Cl.$^7$ .............................................. H01L 21/20
(52) U.S. Cl. .......................................... 438/22; 438/35
(58) Field of Search ..................................... 438/22–47

(56) References Cited

U.S. PATENT DOCUMENTS

| | | | |
|---|---|---|---|
| 5,291,502 A | | 3/1994 | Pezeshki et al. |
| 5,771,253 A | * | 6/1998 | Chang-Hasnain et al. |
| 5,991,326 A | * | 11/1999 | Yuen et al. |
| 6,438,149 B1 | * | 8/2002 | Tayebati et al. |
| 6,546,029 B2 | * | 4/2003 | Sirbu et al. |
| 6,556,610 B1 | * | 4/2003 | Jiang et al. ................. 372/75 |
| 6,581,465 B1 | * | 6/2003 | Waters et al. ............ 73/514.26 |
| 6,611,539 B2 | * | 8/2003 | Ledentsov et al. ............ 372/20 |
| 6,611,544 B1 | * | 8/2003 | Jiang et al. .................... 372/50 |
| 2001/0021214 A1 | * | 9/2001 | Jiang et al. .................... 372/50 |
| 2002/0054618 A1 | * | 5/2002 | Jiang et al. .................... 372/50 |
| 2002/0131464 A1 | * | 9/2002 | Sirbu et al. .................... 372/45 |
| 2002/0176473 A1 | * | 11/2002 | Moooradian et al. |
| 2003/0002545 A1 | * | 1/2003 | Jiang et al. |
| 2003/0007538 A1 | * | 1/2003 | Jiang et al. .................... 372/75 |
| 2003/0058902 A1 | * | 3/2003 | Yuen et al. |
| 2003/0091072 A1 | * | 5/2003 | Wang et al. |

FOREIGN PATENT DOCUMENTS

WO     WO 99/34484     7/1999

OTHER PUBLICATIONS

Okamoto, Hiroshi et al., "Non–Destructive Characterization of InGasP/InP Distributed Bragg Reflectors and Regrown Optical Cavity Layers for InP–Based Vertical–Cavity Surface–Emitting Lasers" Japan Journal of Applied Physics, vol. 36, Part 1, No. 8, Aug. 1997, pp. 5365–5370.

* cited by examiner

Primary Examiner—Savitri Mulpuri

(57) ABSTRACT

Vertical cavity optical devices, and a method of manufacturing therefor, are provided where the method includes partially forming a first vertical cavity optical device on a wafer, adjusting the lasing wavelength of the first vertical cavity optical device, and fixing the lasing wavelength of the first vertical cavity optical device to complete the forming thereof.

8 Claims, 3 Drawing Sheets

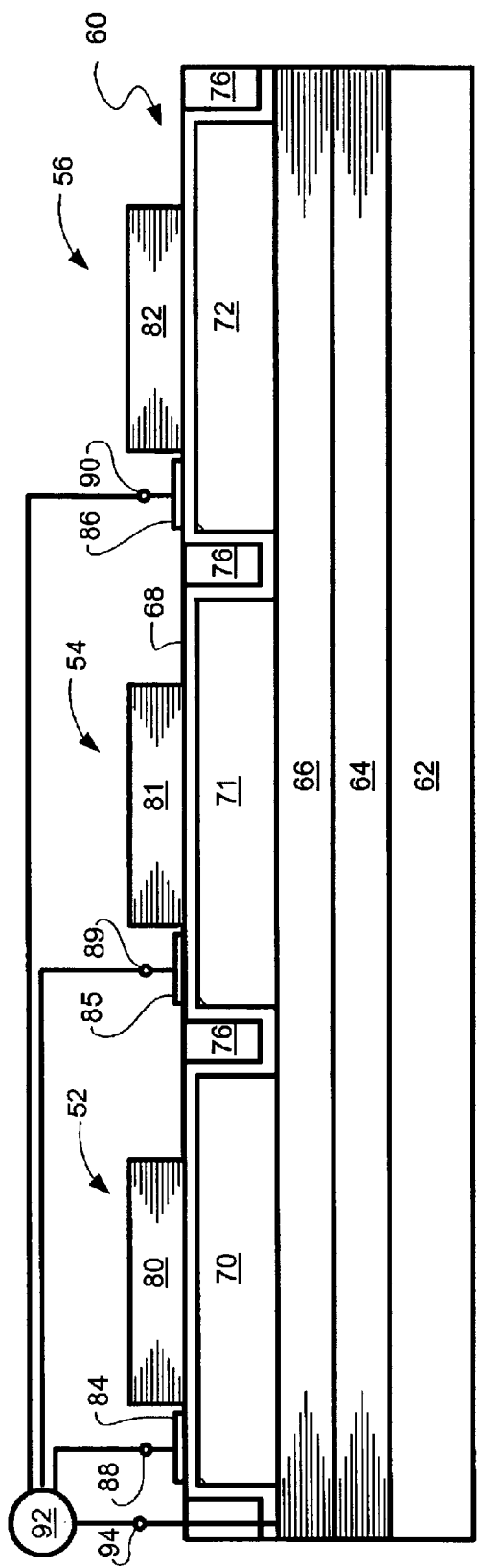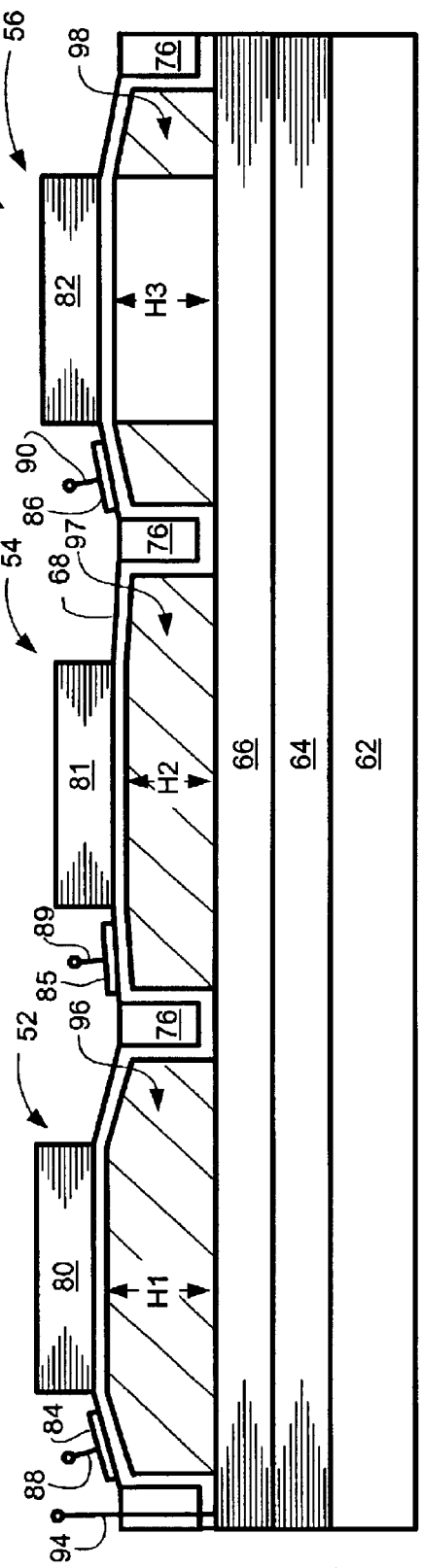

FIXED WAVELENGTH VERTICAL CAVITY OPTICAL DEVICES AND METHOD OF MANUFACTURE THEREFOR

BACKGROUND

1. Technical Field

The present invention relates generally to vertical cavity optical devices, and more specifically to fixed wavelength vertical cavity optical devices or arrays of vertical cavity optical devices.

2. Background Art

Vertical cavity surface emitting lasers (VCSELs) are revolutionizing the field of telecommunications. They generally consist of a pair of semiconductor mirrors defining a resonant cavity containing a gain medium of semiconductor materials for amplifying light.

VCSELs have relatively high efficiency, small size, low weight, low power consumption, and the capability to be driven by low-voltage power. They can operate in a single longitudinal mode, or frequency, and produce a circular beam that can easily be coupled into fibers. The surface emission feature allows devices to be packed densely on a wafer, so that two-dimensional arrays are fabricated relatively easily.

VCSELS use semiconductor materials comprised of elements such as aluminum, indium, gallium, arsenic, nitrogen, and phosphorous as the gain medium, and alternating high and low index of refraction materials such as silicon and silicon dioxide for the semiconductor mirrors or distributed Bragg reflectors (DBRs).

The lasing wavelength of a VCSEL is determined by the optical height of its resonant, Fabry-Perot cavity. Most commonly the optical cavity height, and thus the wavelength, is determined by the thicknesses of the semiconductor layers in the devices. These thicknesses are set during the growth of the semiconductor layers and are nominally the same for all the lasers on given wafer.

The resonant cavity of some VCSELs also includes an air gap, where the size of the air gap partly determines the output wavelength of the laser.

Alignment of the wavelength of maximum gain for the laser gain media and the cavity modes of the laser, set by the optical cavity height of the structure significantly increases the difficulty of producing VCSELs. This is a big yield problem in VCSEL manufacturing because the optical cavity height is permanently set during the material fabrication process making it impossible to adjust later. Also, this limits the temperature range of useful performance for VCSELs since the optical cavity height changes with temperature due to the thermal expansion of the laser material.

An array of monolithic multiple-wavelength VCSELs requires side-by-side fabrication of VCSELs on a wafer where the VCSELs need to be exactly the same except with controlled, different lasing wavelengths. This presents a problem because the processing used on the wafer must assure that the threshold gain at which lasing begins, the current usage, the efficiency, the losses of light in the resonant cavity, the amplification of the gain material, and the light transmission of the DBR all remain the same. At the same time, the same processing must produce different lasing wavelengths, which is most commonly realized by changing the optical height of the resonant cavity.

Solutions to these problems have been long sought but have long eluded those skilled in the art.

SUMMARY OF THE INVENTION

The present invention provides vertical cavity optical devices, and a method of manufacturing therefor, where the method includes partially forming a first vertical cavity optical device on a wafer, adjusting the lasing wavelength of the first vertical cavity optical device, and fixing the lasing wavelength of the first vertical cavity optical device to complete the forming thereof. In this way, the Fabry-Perot resonance and the semiconductor gain-peak can be aligned subsequent to the fabrication of the semiconductor material.

The above and additional advantages of the present invention will become apparent to those skilled in the art from a reading of the following detailed description when taken in conjunction with the accompanying drawings.

BRIEF DESCRIPTION OF THE DRAWINGS

FIG. 2 is a cross-sectional view of a monolithic array of VCSELs of the present invention in one stage of manufacturing;

FIG. 3 is a cross-sectional view of the monolithic array of VCSELs in accordance with the present invention;

DETAILED DESCRIPTION OF THE INVENTION

For purposes of the present invention, the vertical resonant cavity device is referred to as a vertical cavity optical device (VCOD). This is because in addition to VCSELs the invention can also be used to make detectors, Fabry-Perot filters, or other optical devices that require a range of resonant cavity wavelengths.

In addition, for purposes of convenience, the term "horizontal" as used in herein is defined as a plane parallel to the conventional plane or surface of a wafer upon which the VCODs are formed regardless of the orientation of the wafer. The term "vertical" or "thickness" refers to a direction perpendicular to the horizontal as just defined. Terms, such as "on", "above", "below", "upper", "lower", "over", and "under", are defined with respect to the horizontal plane. The descriptions of the positions of the various elements in the various embodiments are not intended to be limiting and many other positions would be evident to those skilled in the art.

Figure 1:
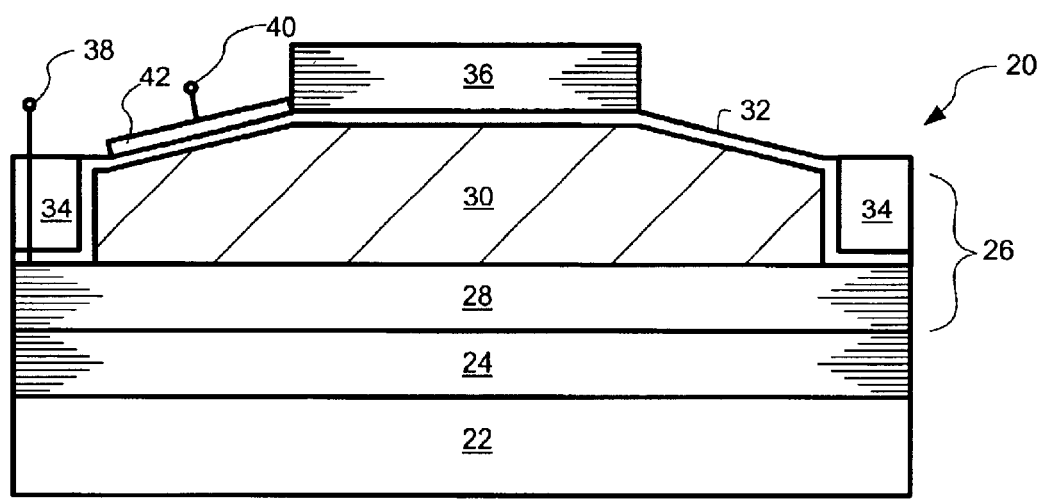
FIG. 1 is a cross-sectional view of a vertical cavity surface emitting laser (VCSEL) in accordance with the present invention.

Referring now to FIG. 1, therein is shown a cross-sectional view of a vertical cavity surface emitting laser or VCSEL 20 in accordance with the present invention. As explained above, the VCSEL is only one example of a VCOD. Above a substrate 22 is a lower mirror or distributed Bragg reflector (DBR) 24, which consists of a plurality of alternating high and low index of refraction materials. The DBR 24 can be made from a number of different combinations of materials including semiconductor layers, dielectric materials such as $TiO_2$ and $SiO_2$, or hybrid combinations of semiconductor, dielectric and metal layers. Each of the layers has an optical thickness of ~¼ of a wavelength.

Above the DBR 24 is a vertical resonant cavity 26, which consists of a photoactive semiconductor structure 28 and a fixative material 30. The photoactive semiconductor structure contains a quantum well for providing laser light. The fixative material 30 fills the space above the photoactive semiconductor structure 28 and below a reflector support 32, which is above the photoactive semiconductor structure 28 and held by an anchor 34. Mounted on and above the reflector support 32 is an upper mirror or DBR 36, which has exactly the opposite arrangement of alternating layers of λ/4 thick low and high index of refraction materials from the DBR 24 so as to cause reflection of light from the DBR 36 back to the DBR 24. Depending upon the relative reflectivity of the DBRs 24 and 36, light will be emitted upward through the DBR 36 and the fixative material 30 or downward through the DBR 24 and the substrate 22.

The VCSEL 20 also includes an electrode 38 connected to the photoactive semiconductor substrate 28 and an electrode 40 connected to a capacitive conductor 42, which are used during the manufacturing process.

Referring now to FIG. 2, therein is shown a cross-sectional view of a partly formed monolithic array of VCSELs 60 of the present invention in one stage of manufacturing. By way of example, first, second, and third VCSELs 52, 54, and 56 have been partially formed on a monolithic substrate. A common substrate 62 carries a lower DBR 64, and a photoactive semiconductor structure 66. A reflector support 68 has been formed to define a plurality (three in the present example) of air gaps 70–72 and is held in place by an anchor 76. Mounted on and above the reflector support 68 are a plurality of upper DBRs 80–82, which are respectively over the air gaps 70–72. Adjacent to each of the upper DBRs 80–82 is a capacitive conductor 84–86, respectively, having an electrode 88–90, respectively.

The lasing wavelength of the first, second, and third VCSELs 52, 54, and 56 associated with the upper DBRs 80–82 is capable of being tuned by adjusting the heights of the respective air gaps 70–72 and this can be accomplished by imposing a voltage across the photoactive semiconductor structure 66 and the respective arms 88–90.

During the manufacturing process in accordance with the present invention, a voltage generator 92 is connected to a common electrode 94, which is connected to the photoactive semiconductor structure 66, and to the electrodes 88–90. Different voltages are applied to provide different height air gaps 70–72 and a structure is used to hold the different height air gaps 70–72. For example, a fixative material is introduced into the air gaps 70–72 to fix the air gap heights and therefore the lasing wavelengths.

Referring now to FIG. 3, therein is shown a cross-sectional view of a completed monolithic array of VCSELs 95 in accordance with the present invention. The same numbers represent the same elements as in FIG. 2.

The first, second, and third VCSELs 52, 54, and 56 have been set to different lasing wavelengths by adjusting the air gaps 70–72 of FIG. 2 to different heights H1, H2, and H3, and filling them with fixative material 96, 97, and 98. As shown, the fixative material 96 and 97 are transparent, such as a transparent epoxy, and the fixative material 98 is shown as an annular ring of fixative material, which could be an opaque epoxy with an open center or an opaque epoxy with a transparent epoxy center so the center lasing area is kept clear.

By selection of the fixative material with the proper thermal expansion coefficients, it is possible to eliminate or at least minimize the effects of thermal expansion, which cause changes in the lasing wavelength of typical VCSELs.

Figure 4:
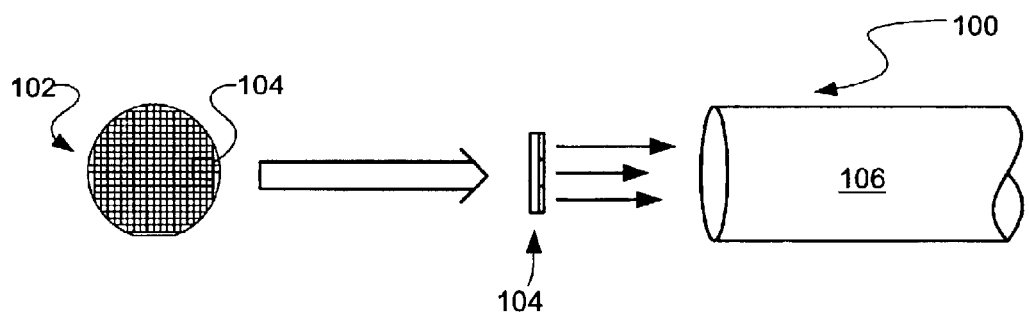
FIG. 4 is a schematic illustration of how an optical communication system is assembled in accordance with the present invention.

Referring now to FIG. 4, therein is shown a schematic illustration of how an optical communication system 100 is assembled in accordance with the present invention. A wafer 102 will have a plurality of VCSELs formed on it in accordance with the present invention. A portion having a monolithic array 104 of VCSELs from the wafer 102 will be packaged and used with a fiber optic communication system represented by an optical fiber 106.

Figure 5:
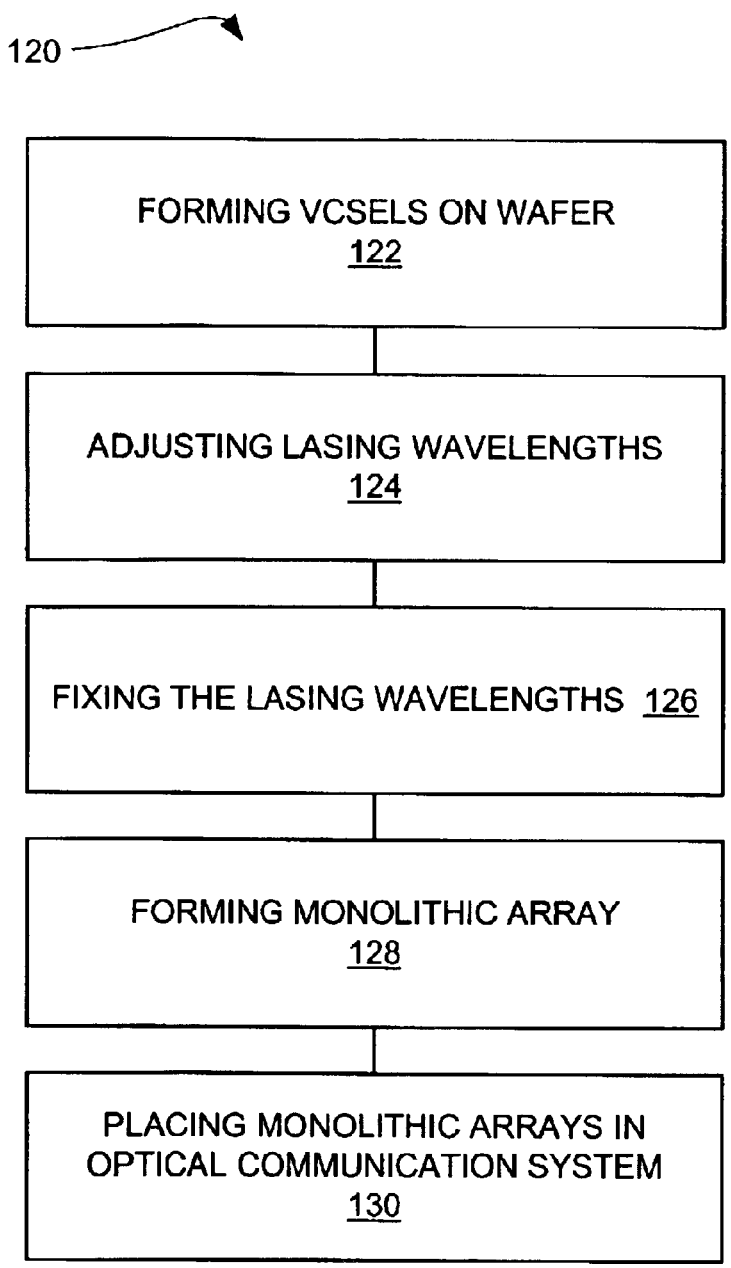
FIG. 5 is a simplified flow chart of the method of manufacturing the present invention.

Referring now to FIG. 5, therein is shown a flow chart 120 of a method for manufacturing the optical communication system 100 according to the present invention. A first step 122 is forming the VCSELs 52, 54, and 56 on a wafer 62. A second step 124 is adjusting the lasing wavelengths of the VCSELs 52, 54, and 56 by changing the air gaps. A third step 126 is fixing the lasing wavelengths by filling the air gaps with the fixative material 96–98. A fourth step 128 involves forming the monolithic array 104. And a fifth step 130 is placing the monolithic arrays 104 in the optical communication system 100.

It will be understood that the flow chart 120 is merely exemplary and many other steps may be added and some removed as would be evident to those having ordinary skill in the art from a reading of the above disclosure.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit of the included claims. All matters hither-to-fore set forth herein or shown in the accompanying drawings are to be interpreted in an illustrative and non-limiting sense.

The invention claimed is:

1. A method for manufacturing vertical cavity optical devices comprising:
    forming a first vertical cavity optical device including an upper and lower reflector on a wafer;
    adjusting the lasing wavelength of the first vertical cavity optical device by moving the upper reflector;
    fixing the lasing wavelength of the first vertical cavity optical device by fixing the position of the upper reflector thereof; and
    forming a monolithic array with a second vertical cavity optical device having a fixed lasing wavelength different from the fixed lasing wavelength of the first vertical cavity optical device.

2. The method for manufacturing the vertical cavity optical devices as claimed in claim 1 wherein:
    fixing the lasing wavelength uses a fixative material in an air gap of the first vertical cavity optical device.

3. The method for manufacturing the vertical cavity optical devices as claimed in claim 1 wherein:
    fixing the lasing wavelength uses a fixative material.

4. The method for manufacturing the vertical cavity optical devices as claimed in claim 1 wherein:
    fixing the lasing wavelength uses a fixative material having a coefficient of thermal expansion compensating the remainder of the first vertical cavity optical device.

5. A method for manufacturing vertical cavity optical devices comprising:
    forming a first adjustable vertical cavity optical device on a substrate;
    adjusting the lasing wavelength of the first adjustable vertical cavity optical device using a voltage;
    fixing the lasing wavelength of the first adjustable vertical cavity optical device by fixing a height of an air gap therein to complete the forming thereof; and forming a monolithic array with a second adjustable vertical cavity optical device having a fixed lasing wavelength different from the fixed lasing wavelength of the first vertical cavity optical device.

6. The method for manufacturing the vertical cavity optical devices as claimed in claim 5 wherein:

fixing the lasing wavelength uses a fixative material in the air gap of the first adjustable vertical cavity optical device filling the height of the air gap.

7. The method for manufacturing the vertical cavity optical devices as claimed in claim 5 including:

fixing the lasing wavelength uses a fixative material selected from a group consisting of being transparent, opaque, and a combination thereof.

8. The method for manufacturing the vertical cavity optical devices as claimed in claim 5 including:

fixing the lasing wavelength uses a fixative material having a coefficient of thermal expansion that compensates for the remainder of the first adjustable vertical cavity optical device.

* * * * *